US009953904B1

(12) United States Patent
Oratti Kalandar et al.

(10) Patent No.: US 9,953,904 B1
(45) Date of Patent: Apr. 24, 2018

(54) ELECTRONIC COMPONENT PACKAGE WITH HEATSINK AND MULTIPLE ELECTRONIC COMPONENTS

(71) Applicant: FREESCALE SEMICONDUCTOR, INC., Austin, TX (US)

(72) Inventors: Navas Khan Oratti Kalandar, Austin, TX (US); Akhilesh Kumar Singh, Austin, TX (US); Nishant Lakhera, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/333,580

(22) Filed: Oct. 25, 2016

(51) Int. Cl.
| | |
|---|---|
| *H01L 23/495* | (2006.01) |
| *H01L 23/34* | (2006.01) |
| *H01L 23/36* | (2006.01) |
| *H01L 23/367* | (2006.01) |
| *H01L 21/48* | (2006.01) |
| *H01L 23/31* | (2006.01) |
| *H01L 21/56* | (2006.01) |
| *H01L 21/78* | (2006.01) |

(52) U.S. Cl.
CPC .... *H01L 23/49568* (2013.01); *H01L 21/4825* (2013.01); *H01L 21/4882* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49551* (2013.01); *H01L 23/49575* (2013.01); *H01L 21/4871* (2013.01); *H01L 23/34* (2013.01); *H01L 23/36* (2013.01); *H01L 23/3672* (2013.01); *H01L 23/3677* (2013.01)

(58) Field of Classification Search
CPC ............ H01L 21/4871; H01L 21/4882; H01L 23/3364; H01L 23/36; H01L 23/3672; H01L 23/34; H01L 23/3677; H01L 23/49568
See application file for complete search history.

(56) References Cited

U.S. PATENT DOCUMENTS

| | | | |
|---|---|---|---|
| 5,311,060 A * | 5/1994 | Rostoker | H05K 3/303 257/667 |
| 5,679,975 A | 10/1997 | Wyland et al. | |
| 5,723,899 A | 3/1998 | Shin | |
| 6,146,921 A * | 11/2000 | Barrow | H01L 21/565 257/706 |
| 6,326,696 B1 | 12/2001 | Horton et al. | |
| 7,081,678 B2 | 7/2006 | Liu | |
| 7,125,745 B2 | 10/2006 | Chen et al. | |
| 7,323,769 B2 * | 1/2008 | Tan | H01L 23/3107 257/666 |
| 7,535,110 B2 | 5/2009 | Wu et al. | |
| 7,554,185 B2 | 6/2009 | Foong et al. | |

(Continued)

*Primary Examiner* — David Zarneke

(57) ABSTRACT

An electronic component package that includes a heat spreader with a die pad. An electronic component is attached to each side of the die pad where each electronic component includes conductive terminals on a side facing away from the die pad. Conductive terminals of the top electronic component are wirebonded to conductive surfaces of a package substrate and conductive terminals of the bottom electronic component are physically and electrically attached to conductive surfaces of the package substrate. The heat spreader structure includes tie structures that extend in a direction away from the second electronic component.

20 Claims, 4 Drawing Sheets

(56) References Cited

U.S. PATENT DOCUMENTS

| | | | |
|---|---|---|---|
| 7,902,644 B2 | 3/2011 | Huang et al. | |
| 8,610,262 B1* | 12/2013 | McLellan | H01L 23/42 |
| | | | 257/706 |
| 8,901,722 B2 | 12/2014 | Ge et al. | |
| 2002/0186542 A1* | 12/2002 | Choi | H01L 23/36 |
| | | | 361/719 |
| 2003/0034557 A1* | 2/2003 | Gupta | H01L 23/13 |
| | | | 257/729 |
| 2006/0231944 A1* | 10/2006 | Huang | H01L 21/4878 |
| | | | 257/706 |
| 2007/0080437 A1* | 4/2007 | Marimuthu | H01L 21/561 |
| | | | 257/676 |
| 2008/0157401 A1* | 7/2008 | Kim | H01L 23/49551 |
| | | | 257/787 |
| 2009/0039485 A1* | 2/2009 | Lee | H01L 21/565 |
| | | | 257/676 |
| 2012/0126387 A1* | 5/2012 | Fishley | H01L 23/3128 |
| | | | 257/690 |
| 2012/0193772 A1 | 8/2012 | Jiang | |
| 2013/0313698 A1* | 11/2013 | Chen | H01L 23/36 |
| | | | 257/690 |
| 2014/0042644 A1 | 2/2014 | Haba et al. | |
| 2014/0213018 A1* | 7/2014 | Higgins, III | H01L 23/36 |
| | | | 438/118 |
| 2014/0353816 A1* | 12/2014 | Yap | H01L 23/3735 |
| | | | 257/713 |
| 2015/0107625 A1 | 4/2015 | Erwin et al. | |
| 2015/0108625 A1 | 4/2015 | Ge et al. | |
| 2015/0357261 A1* | 12/2015 | Tsuji | C08K 3/00 |
| | | | 257/712 |

* cited by examiner

ELECTRONIC COMPONENT PACKAGE WITH HEATSINK AND MULTIPLE ELECTRONIC COMPONENTS

BACKGROUND OF THE INVENTION

Field of the Invention

This invention relates to electronic component packages and electronic component packages with multiple electronic components and a heat spreader structure.

Description of the Related Art

Electronic components such as integrated circuits and discrete components (e.g. capacitors, inductors resistors, fuses) are implemented in packages for use in electronic systems such as e.g. computers, smartphones, process controllers, robotic machinery, and automobiles.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As set forth herein, an electronic component package includes a first electronic component including conductive terminals on a first side. The first side is attached to package substrate at a first side with the conductive terminals being electrically coupled to conductive surfaces of the package substrate. A first side of a die pad of a heat spreader structure is attached to a second side of the electronic component. A first side of a second electronic component is attached to the second side of the die pad. The second side of the second electronic component includes conductive terminals that are wirebonded to conductive surfaces of the package substrate. The heat spreader structure includes tie structures extending from the die pad upward and include surfaces that a heat spreader plate structure is attached to. The wirebonds extend between the tie structures and the heat spreader plate. In some embodiments, the following configuration may allow for a package to have two electronic components each thermally attached to a die pad of a heat spreader that are attached to a heat spreader plate wherein the conductive terminals of both electronic components are coupled to conductive surfaces of the package substrate. With some embodiments, such a configuration may provide for a multiple component package that has multiple components attached to a heat spreader structure. Accordingly, such a package may have a smaller foot print and with good heat management properties that can be formed from less complex processes.

Figure 1:
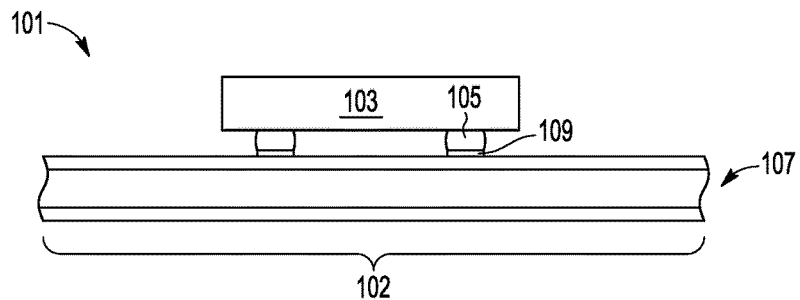
FIGS. 1-2 and 4-6 set forth partial cutaway side views of various stages in the manufacture of an electronic component package according to one embodiment of the present invention.

FIG. 1 is a partial cutaway side view of an assembly 101 used in forming electronic component packages according to one embodiment of the present invention. Assembly 101 includes a package substrate 107 and an electronic component 103 attached to substrate 107 at package site 102. In one embodiment, substrate 107 is a circuit board made of dielectric material with conductive structures (e.g. pad 109) located on the top side and the bottom side (bottom conductive structures not shown in FIG. 1) of substrate 107 (relative to the view shown in FIG. 1). Substrate 107 includes conductive vias (not shown) for electrically coupling the top pads (e.g. 109) to the bottom pads (not shown). In some embodiments, substrate 107 may include intermediate horizontal conductive interconnects (not shown) located in one or more layers between the top surface and the bottom surface of substrate 107 for conveying signals to different locations in the substrate.

In the embodiment of FIG. 1, only a portion of substrate 107 is shown. The other portions of substrate 107 would include other package locations (not shown) with other components similar to component 103 attached thereto. In subsequent stages, the package locations would be singulated from each other to form a number of electronic component packages. With some embodiments, substrate 107 is a panel with an array of package locations (e.g. N×M) where N and M can be equal to 1 or greater. In other embodiments, package substrate 107 may include only one package site 102. In other embodiments, substrate 107 may be another type of package substrate such as a lead frame or flexible circuit substrate.

In the embodiment shown, component 103 is a semiconductor die singulated from a processed semiconductor wafer (not shown). In one embodiment, component 103 implements an integrated circuit such as a processor, microcontroller, memory device, analog circuit, mixed signal circuit, programmable logic, MEMS device, or other type of integrated circuit. However, in other embodiments, component 103 may be another type of electronic component such as a capacitor, resistor, fuse, or inductor.

Component 103 includes conductive terminals electrically coupled to electrically conductive structures (not shown) in component 103. In the embodiment shown, the conductive terminals are solder bumps (105), but may be other types of conductive terminals (e.g. pads, posts) in other embodiments. In the embodiment shown, component 103 is attached to the top side of substrate 107. In one embodiment of an attachment process, the solder bumps (105) are aligned to conductive pads (109) on the top side of substrate 107. The substrate 107 and component 103 are heated such that the solder bumps (105) reflow to be physically and electrically attached to the pads (109). In one embodiment, component 103 is attached to substrate 107 in a flip chip configuration.

Figure 2:
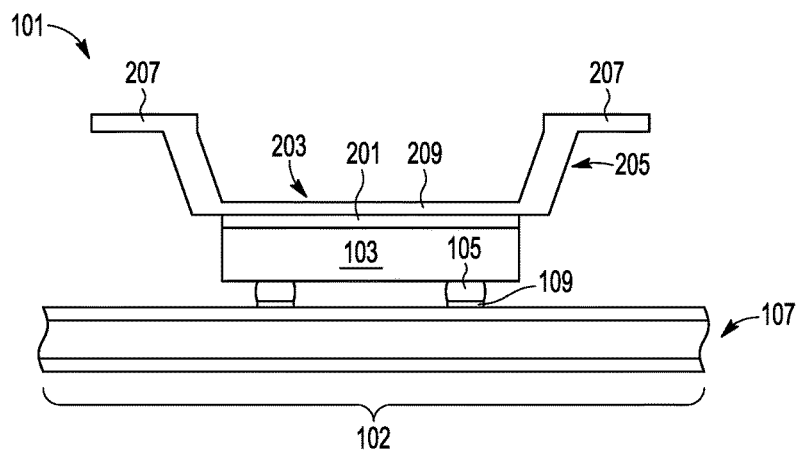
Figure 3:
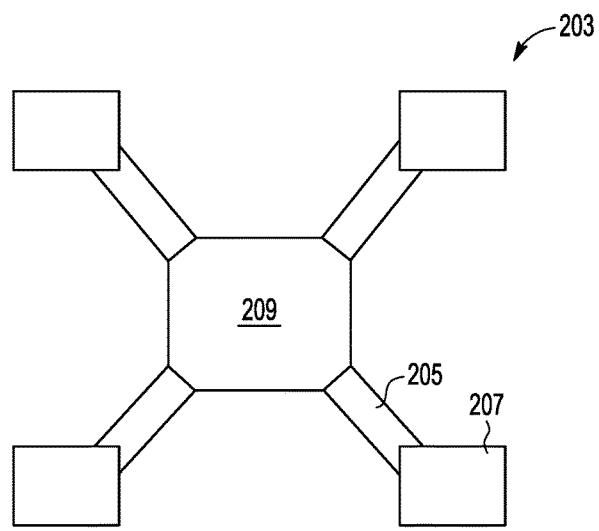
FIG. 3 is a top view of a heat spreader structure according to one embodiment of the present invention.

FIG. 2 is a partial cut away side view of assembly 101 after a heat sink structure 203 is attached to the upper side of component 103. In the embodiment shown, heat sink structure 203 includes a die pad 209 and tie structures 205. Tie structures 205 include support pads 207 located at one end of the tie structures 205. FIG. 3 shows a top view of heat sink structure 203.

Referring back to FIG. 2, in one embodiment, the bottom side of pad 209 is attached to the top side of component 103 with a thermally conductive adhesive 201. In one embodiment, the adhesive has a low modulus. In one embodiment, the adhesive is die attach paste which includes a thermal interface material that is based on an epoxy or a silicone material, but may be another type of adhesive in another embodiment. In one embodiment, pad 209 is attached to component 103 with solder. In one embodiment heat sink structure 203 is made of an electrically conductive material and component 103 includes a conductive terminal such as a ground terminal (not shown) on its top side where the adhesive is electrically conductive to electrically couple the heatsink structure 203 to the conductive terminal.

In the embodiment shown, the tie structures 205 have a portion with a straight bar form that extends from die pad 209 to the support pads 207. However, in other embodiments, tie structures may have other forms such as a rounded form, a stair step form, an "L" shaped form, or a "C" shaped form. In some embodiments, tie structures 205 have openings.

In one embodiment, heat sink structure 203 is integrally formed from a thermally conductive material (e.g. copper, aluminum, steel). In one embodiment, heat sink structure 203 is formed by molding thermally conductive material or formed from a sheet of terminally conductive material that is cut and bent to the shape shown in the Figures or to another desired shape. In other embodiments, structure 203 is formed from a block of thermally conductive material. In still other embodiments, the components of heat sink structure 203 (pad 209, tie structures 205, and support pads 207) can be separately formed and subsequently attached. The structures of heat sink structure 203 are of a sufficient size and thickness to provide the desired heat conveying capacity for the package. In the embodiment shown, die pad 209 is shown as a solid plate. However, in other embodiments, pad 209 may have openings.

In the embodiment shown, heat sink structure 203 is shown as being separate from other similar heat sink structures (not shown) that are attached to other electronic components (not shown) similar to component 103 at other package sites of substrate 107. However, in other embodiments, the heat sink structures are joined together (e.g. at the support pads 207) such that they are attached as a unit. In such an embodiment, the heat sink structures (203) would be separated when assembly 101 is subsequently singulated.

In the embodiment shown, the support pads (207) are shown as rectangle structures, but may be of other forms in other embodiments. Other embodiments may not include the support pads 207. In still other embodiments, the tie structures can extend from the sides between the corners of die pad 209.

Figure 4:
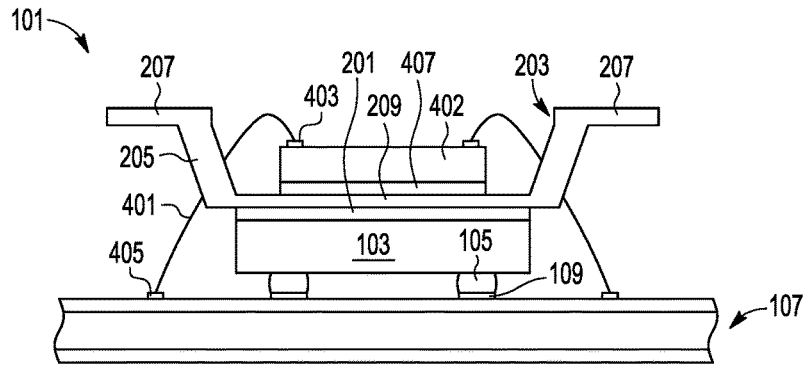

FIG. 4 is a partial cutaway side view of assembly 101 after an electronic component 402 is attached to the top side of die pad 209. In the embodiment shown, component 402 is an integrated circuit die, but may be another type of electronic component in other embodiments. Component 402 includes conductive terminals (pads 403) located on its top side that are wirebonded with wirebonds 401 (e.g. gold, copper) to conductive pads 405 on the top surface of substrate 107.

Prior to wirebonding, component 402 is attached to the top surface of die pad 209 with a thermally conductive adhesive (407) with component 402 being in a configuration where the pads (403) face upward for wire bonding. In one embodiment, component 402 is attached to pad 209 with solder. In one embodiment, component 402 may include a conductive terminal on the bottom side of component 402 that is electrically coupled to pad 209 with a conductive adhesive. In one embodiment, component 103 is an integrated circuit whose active side is facing downward and component 402 is an integrated circuit whose active side is facing upward.

Figure 5:
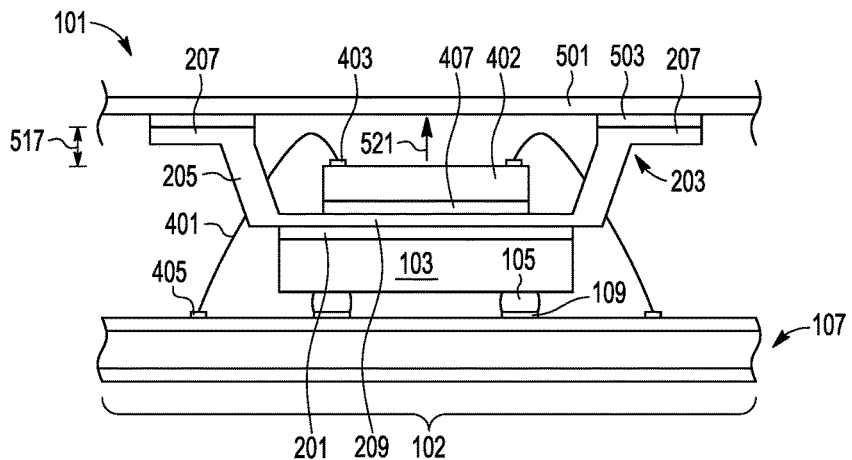

FIG. 5 is a partial cutaway view of assembly 101 after a heat spreader plate structure 501 is attached to the top surfaces of support pads 207 of heat spreader structure 203. In one embodiment, structure 501 is attached to support pads 207 with a thermally conductive adhesive 503. In one embodiment, plate structure 501 is a flat piece of heat spreading material that extends out past package site 102 to other package sites (not shown) of assembly 101 and is thermally attached to other heat spreader structures of the other package sites. In such embodiments, the plate structure 501 will be subsequently singulated with the singulation of assembly 101.

As shown in the embodiment of FIG. 5, tie structures 205 extend upward in the view of FIG. 5 to provide vertical separation 517 in a direction 521 that is orthogonal to the top side of component 402 between the top surfaces of support pads 207 and component 402. This separation 517 allows for wire bonds 401 to be attached to the pads 403 on the top side of component 402 without contacting plate structure 501. In the embodiment shown, the wirebonds 401 extend from pads (403) through openings formed by the tie structures 205 and plate structure 501 to the pads (405) on substrate 107.

In one embodiment, plate structure 501 is a flat, solid plate of thermally conductive material (e.g. copper, aluminum, steel). In other embodiments, plate structure 501 may include openings and/or have undulations. In other embodiments, plate structure 501 may include separately formed structures. In one embodiment, plate structure 501 has a thickness of 1 mm, but may have other thicknesses in other embodiments.

Figure 6:
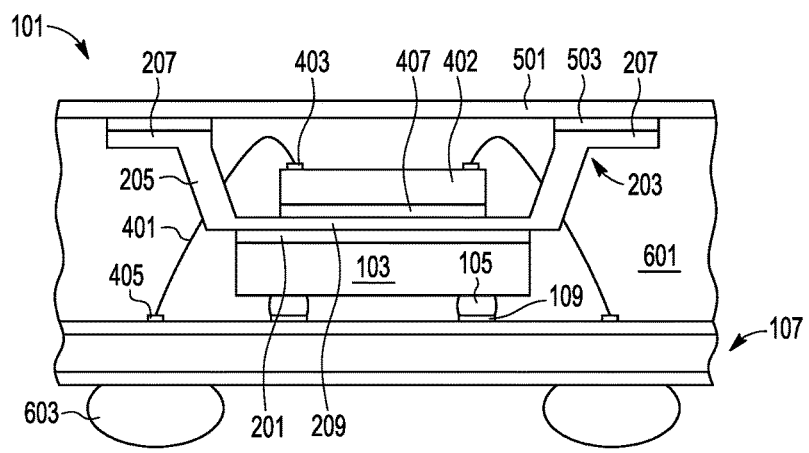

FIG. 6 is a partial cutaway side view of assembly 101 after the assembly has been encapsulated with an encapsulant 601. In one embodiment, the encapsulant is a mold compound (e.g. plastic, resin, composite, elastomer, thermoplastic, thermoset, or silicone molding compound). The encapsulant 601 can be applied by an injection, compression, or transfer molding process, or by another type of encapsulating process. In the embodiment shown, encapsulant 601 is located between plate structure 501 and substrate 107, but in other embodiments, encapsulant may be located outside of those areas.

In the embodiment shown, after the encapsulation, solder balls 603 are attached to the conductive pads (not shown) on the bottom side of substrate 107.

Figure 7:
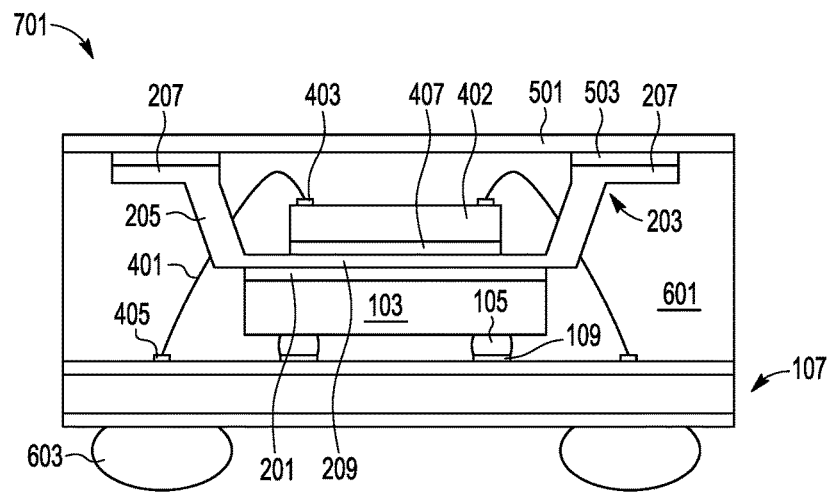
FIG. 7 sets forth a cutaway side view of an electronic component package according to one embodiment of the present invention.

FIG. 7 is a cut away side view of electronic component package 701 after assembly 101 has been singulated into a number of electronic component packages. Assembly 101 can be singulated by singulation processes such sawing or laser cutting.

Figure 8:
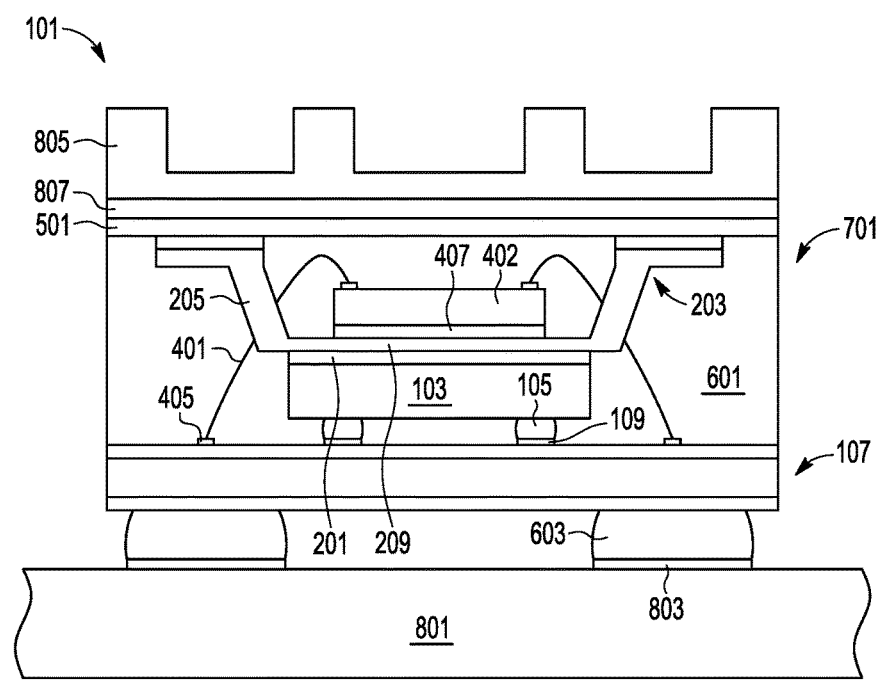
FIG. 8 sets forth a cutaway side view of an electronic component package according to one embodiment of the present invention.

FIG. 8 shows a partial cutaway side view of electronic component package 701 attached to a circuit board 801 of an electronic system. In the embodiment shown, package 701 is attached to circuit board 801 by reflowing solder balls 603 to pads 803. In one embodiment, component 103 includes a processor and component 402 includes a memory operably coupled to the processor. However, other types of components maybe be implemented in other packages in other embodiments. For example, component 103 may be an ASIC or power management device and component 402 may be a MEMS device.

Also shown in FIG. 8, an external heatsink structure 805 is attached with thermal adhesive 807 to plate structure 501.

In some embodiments, package 701 can include other electronic components as well. For example, a third electronic component (not shown) can be stacked on component 402 such that the conductive pads of the third electronic component that can be wirebonded to pads on substrate 107. Also, an additional electronic component (not shown) maybe located adjacent to component 402 on die pad 209 or adjacent to component 103 on substrate 107.

Figure 9:
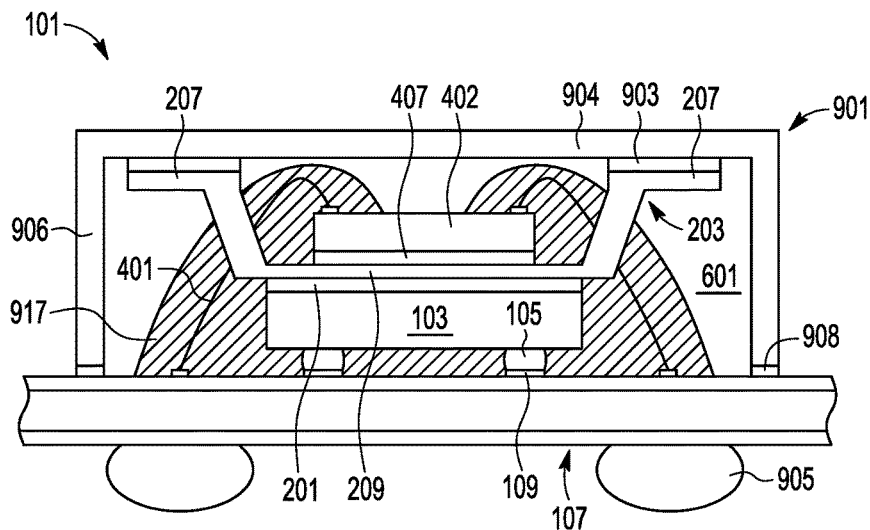
FIG. 9 sets forth a partial cutaway side view of a stage in the manufacture of an electronic component package according to another embodiment of the present invention.
Figure 10:
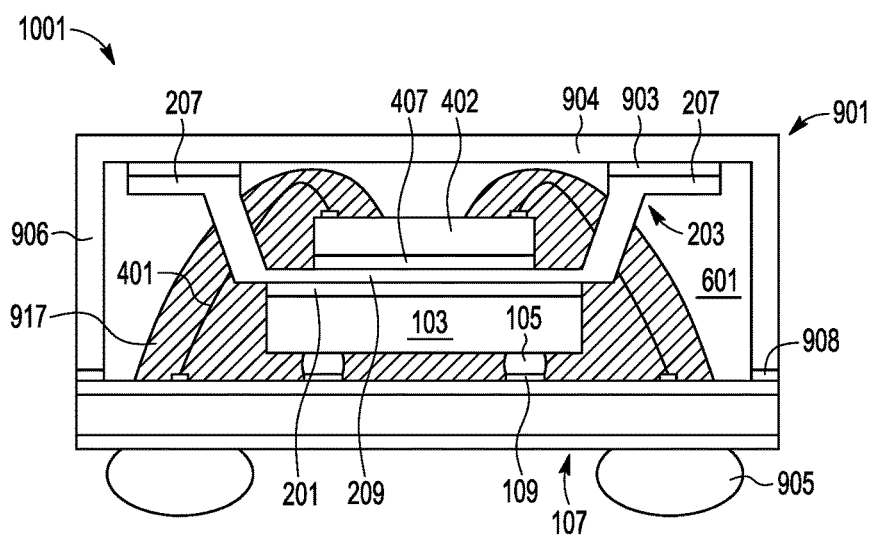
FIG. 10 sets forth a cutaway side view of an electronic component package according to another embodiment of the present invention.

FIGS. 9 and 10 set forth views in the manufacture and implementation of an electronic component package according to another embodiment of the present invention. In this alternative embodiment, FIG. 9 shows a partial cutaway side view of a stage in the manufacture of an electronic component package after the stage shown in FIG. 4. Instead of adding a flat plate structure 501 as shown in FIG. 5, in the alternative embodiment of FIG. 9, a cap structure 901 is attached to substrate 107 with adhesive 908 and thermally attached to support pads 207 of heat sink structure 203 with thermally conductive adhesive 903. In the embodiment shown, cap structure 901 includes a top plate structure 904 and sidewalls 906. In one embodiment, top plate structure 901 and sidewalls 906 are integrally formed. In another embodiment, they are formed separately. In one embodiment, top plate structure 901 and sidewalls 906 are solid, flat plates, but in other embodiments, these structures may have openings and/or may have undulations. In the embodiment shown, cap structure 901 is a rectangular box, but may have other forms in other embodiments.

Prior to attaching cap structure 901, the wirebonds 401 are encapsulated with an encapsulant 917. In one embodiment, encapsulant 917 is a glob top, gel material and is applied by a glob top process. However, encapsulant 917 may be made of other materials and/or applied by other processes. In other embodiments, all of the empty space within the cap structure 901 is encapsulated.

After the attachment of cap structure 901, solder balls 905 are attached to conductive pads (not shown) of substrate 107.

FIG. 10 shows a cutaway side view of electronic component package 1001 after assembly 101 has been singulated into multiple electronic component packages (the others not shown). Afterwards, package 1001 can be implemented in an electronic system similar as described with package 701.

Forming an electronic component package with a heat spreader structure having a die pad where electronic components are attached to both sides of the die pad such that conductive terminals of the bottom component are electrically and physically coupled to conductive structures of a substrate and conductive terminals of the top electronic component are wirebonded to conductive structures of the substrate may provide for a package where heat can be removed from the electronic components with a heat spreader that is thermally attached to an external plate structure. Also, such a configuration may provide for an electronic component package with a smaller footprint.

In one embodiment, an electronic component package includes a package substrate including a plurality of conductive surfaces on a first side of the package substrate and a first electronic component including a first plurality of conductive terminals located on a first side of the first electronic component. Each of the first plurality of conductive terminals is electrically and physically coupled to a conductive surface of a first set of conductive surfaces of the plurality of conductive surfaces. The package includes a heat spreader structure including a die pad with a first side and a second side. The second side of the die pad being an opposite side to the first side of the die pad. The first side of the die pad is attached to a second side of the first electronic component. The second side of the first electronic component being an opposite side to the first side of the first electronic component. The heat spreader structure includes at least one tie structure that extends away from the die pad towards an end surface of at least one end surface of the heat spreader structure. The package includes a plurality of wirebonds and a second electronic component including a first side attached to the second side of the die pad. The second electronic component includes a second side being an opposite side to the first side of the second electronic component. The second side of the second electronic component includes a second plurality of conductive terminals. Each conductive terminal of the second plurality of conductive terminals is wirebonded with a wirebond of the plurality of wirebonds to a conductive surface of a second set of conductive surfaces of the plurality of conductive surfaces of the package substrate. Each end surface of the at least one end surface is spaced apart from the second side of the second electronic component in a direction that is orthogonal to the second side of the second electronic component and that is away from the first side of the second electronic component.

In another embodiment, a method of forming an electronic component package includes attaching a first side of a first electronic component to a first side of a package substrate. The first side of the first electronic component includes a first plurality of conductive terminals. The attaching includes electrically and physically coupling the first plurality of conductive terminals to conductive surfaces of the first side of the package substrate. The method includes attaching a first side of a die pad of a heat spreader structure to a second side of the first electronic component. The second side of the first electronic component being an opposite side to the first side of the first electronic component. The die pad includes a second side being an opposite side to the first side of the die pad. The heat spreader structure includes at least one tie structure that extends away from the die pad to an end surface of at least one end surface of the heat spreader structure. The method includes attaching a first side of a second electronic component to the second side of the die pad. The second electronic component including a second plurality of conductive terminals located on a second side of the second electronic component. The second side being an opposite side to the first side of the second electronic component. Each end surface of the at least one end surface is spaced apart from the second side of the second electronic component in a direction that is orthogonal to the second side of the second electronic component and that is away from the first side of the second electronic component. The method includes wirebonding with a plurality of wirebonds to each of the second plurality of conductive terminals to a conductive surface of the first side of the package substrate.

In another embodiment, an electronic component package includes a package substrate including a plurality of conductive surfaces on a first side of the package substrate. The package includes a heat spreader structure including a die pad with a first side and a second side. The first side is opposite the second side. The heat spreader structure includes a plurality of tie structures extending from the die pad. Each tie structure of the plurality of tie structures including an attachment surface. The package includes a first electronic component including a first plurality of conductive terminals located on a first side of the first electronic component. Each of the first plurality of conductive terminals is electrically and physically coupled to a conductive surface of a first set of conductive surfaces of the plurality of conductive surfaces. The first electronic component including a second side thermally attached to the first side of the die pad. The package includes a plurality of wirebonds and a second electronic component including a first side thermally attached to the second side of the die pad. The second electronic component includes a second side being an opposite side to the first side of the second electronic component. The second side of the second electronic component including a second plurality of conductive terminals. Each conductive terminal of the second plurality of conductive terminals is wirebonded with a wirebond of the plurality of wirebonds to a conductive surface of a second set of conductive surfaces of the package substrate. The attachment surfaces of the plurality of tie structures are spaced apart from the second side of the second electronic component in a direction that is orthogonal to the second side of the second electronic component and that is away from the first side of the second electronic component. The package includes a heat spreader plate structure thermally attached to the attachment surfaces and an encapsulant. The encapsulant encapsulating at least the plurality of wirebonds.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An electronic component package, comprising:
   a package substrate including a plurality of conductive surfaces on a first side of the package substrate;
   a first electronic component including a first plurality of conductive terminals located on a first side of the first electronic component, each of the first plurality of conductive terminals is electrically and physically coupled to a conductive surface of a first set of conductive surfaces of the plurality of conductive surfaces;
   a heat spreader structure including a die pad with a first side and a second side, the second side of the die pad being an opposite side to the first side of the die pad, the first side of the die pad is attached to a second side of the first electronic component, the second side of the first electronic component being an opposite side to the first side of the first electronic component, the heat spreader structure including at least one tie structure that extends away from the die pad towards an end surface of at least one end surface of the heat spreader structure;
   a plurality of wirebonds;
   a second electronic component including a first side attached to the second side of the die pad, the second electronic component including a second side being an opposite side to the first side of the second electronic component, the second side of the second electronic component including a second plurality of conductive terminals, wherein each conductive terminal of the second plurality of conductive terminals is wirebonded with a wirebond of the plurality of wirebonds to a conductive surface of a second set of conductive surfaces of the plurality of conductive surfaces of the package substrate, wherein each end surface of the at least one end surface is spaced apart from the second side of the second electronic component in a direction that is orthogonal to the second side of the second electronic component and that is away from the first side of the second electronic component.

2. The electronic component package of claim 1 further comprising:
   a heat spreader plate structure attached to the end surfaces of the at least one end surface.

3. The electronic component package of claim 2 wherein the heat spreader plate structure is part of a cap structure, the cap structure includes side wall structures that are attached to the package substrate.

4. The electronic component package of claim 2 wherein the heat spreader plate structure is characterizes as a plate of thermally conductive material.

5. The electronic component package of claim 2 wherein the heat spreader plate structure has a surface that is exposed on a first side of the electronic component package.

6. The electronic component package of claim 2 wherein the at least one tie structure and the heat spreader plate structure define at least one opening between the heat spreader plate structure and the die pad, wherein each wirebond of the plurality of wirebonds extends from a conductive terminal of the second plurality of conductive terminals to a conductive surface of the second set of conductive surfaces through an opening of the at least one opening.

7. The electronic component package of claim 1 wherein the plurality of wirebonds are encapsulated in an encapsulant material.

8. The electronic component package of claim 7 wherein the first electronic component, the second electronic component, and the plurality of wirebonds are encapsulated in the encapsulant material.

9. The electronic component package of claim 1 wherein each end surface of the at least one end surface is spaced apart from the second side of the die pad in a direction that is parallel to the second side of the die pad.

10. A method of forming an electronic component package, the method comprising:
    attaching a first side of a first electronic component to a first side of a package substrate, wherein the first side of the first electronic component includes a first plurality of conductive terminals, wherein the attaching includes electrically and physically coupling the first plurality of conductive terminals to conductive surfaces of the first side of the package substrate;
    attaching a first side of a die pad of a heat spreader structure to a second side of the first electronic component, the second side of the first electronic component being an opposite side to the first side of the first electronic component, the die pad including a second side being an opposite side to the first side of the die pad, the heat spreader structure including at least one tie structure that extends away from the die pad to an end surface of at least one end surface of the heat spreader structure;
    attaching a first side of a second electronic component to the second side of the die pad, the second electronic component including a second plurality of conductive terminals located on a second side of the second electronic component, the second side being an opposite side to the first side of the second electronic component, wherein each end surface of the at least one end surface is spaced apart from the second side of the second electronic component in a direction that is orthogonal to the second side of the second electronic component and that is away from the first side of the second electronic component;

wirebonding with a plurality of wirebonds to each of the second plurality of conductive terminals to a conductive surface of the first side of the package substrate.

11. The method of claim 10 further comprising:

attaching a heat spreader plate structure to the end surfaces of the at least one end surface.

12. The method of claim 11 wherein the heat spreader plate structure is part of a cap structure, the cap structure includes side wall structures, the attaching the heat spreader plate structure includes attaching the side walls to the first side of the package substrate.

13. The method of claim 11 wherein the heat spreader plate structure is characterizes as a flat plate of thermally conductive material.

14. The method of claim 11 further comprising encapsulating the first electronic component, the second electronic component, and the plurality of wirebonds with an encapsulant, wherein as a result of the encapsulating, the encapsulant includes a portion located directly between the second side of the second electronic component and the heat spreader plate structure.

15. The method of claim 14 wherein after the encapsulating, a side of the heat spreader plate structure is exposed from the encapsulant.

16. The method of claim 10 further comprising:

encapsulating the plurality of wirebonds in an encapsulant.

17. The method of claim 16 further comprising:

after the encapsulating, singulating the package substrate into a plurality of pieces, wherein the first electronic component package includes a piece of the plurality of pieces, the first electronic component, the second electronic component, and the heat spreader structure.

18. The method of claim 10 wherein as a result of the wirebonding, each wirebond of the plurality of wirebonds extends from a conductive terminal of the second plurality of conductive terminals directly between two tie structures of the at least one tie structure to a conductive surface of the first side of the package substrate.

19. The method of claim 10 wherein the attaching a first side of an electronic component to a first side of a package substrate includes reflowing solder.

20. An electronic component package comprising:

a package substrate including a plurality of conductive surfaces on a first side of the package substrate;

a heat spreader structure including a die pad with a first side and a second side, the first side is opposite the second side, the heat spreader structure including a plurality of tie structures extending from the die pad, each tie structure of the plurality of tie structures including an attachment surface;

a first electronic component including a first plurality of conductive terminals located on a first side of the first electronic component, each of the first plurality of conductive terminals is electrically and physically coupled to a conductive surface of a first set of conductive surfaces of the plurality of conductive surfaces, the first electronic component including a second side thermally attached to the first side of the die pad;

a plurality of wirebonds;

a second electronic component including a first side thermally attached to the second side of the die pad, the second electronic component including a second side being an opposite side to the first side of the second electronic component, the second side of the second electronic component including a second plurality of conductive terminals, wherein each conductive terminal of the second plurality of conductive terminals is wirebonded with a wirebond of the plurality of wirebonds to a conductive surface of a second set of conductive surfaces of the package substrate, wherein the attachment surfaces of the plurality of tie structures are spaced apart from the second side of the second electronic component in a direction that is orthogonal to the second side of the second electronic component and that is away from the first side of the second electronic component;

a heat spreader plate structure thermally attached to the attachment surfaces;

an encapsulant, the encapsulant encapsulating at least the plurality of wirebonds.

* * * * *